United States Patent
Souetinov et al.

(10) Patent No.: US 7,388,446 B2
(45) Date of Patent: Jun. 17, 2008

(54) DIRECTLY MODULATED CMOS VCO

(75) Inventors: Viatcheslav Igorevich Souetinov, Swindon (GB); Alexander Alekseevich Krasin, Moscow (RU); Alexander Victorovich Koulakov, Moscow (RU)

(73) Assignee: Zarlink Semiconductor Ab, Jarfalla (SE)

( * ) Notice: Subject to any disclaimer, the term of this patent is extended or adjusted under 35 U.S.C. 154(b) by 0 days.

(21) Appl. No.: 11/054,829

(22) Filed: Feb. 10, 2005

(65) Prior Publication Data

US 2005/0231296 A1   Oct. 20, 2005

Related U.S. Application Data

(60) Provisional application No. 60/544,169, filed on Feb. 12, 2004.

(30) Foreign Application Priority Data

Sep. 23, 2004   (GB) ................. 0421129.8

(51) Int. Cl.
   *H03B 5/00*   (2006.01)
(52) U.S. Cl. ................ 331/177 V; 331/36 C; 331/167; 332/135; 332/136; 332/141
(58) Field of Classification Search ........... 331/177 V, 331/117 R, 36 C, 167; 332/135, 136, 141
   See application file for complete search history.

(56) References Cited

U.S. PATENT DOCUMENTS

| | | | |
|---|---|---|---|
| 5,502,420 A | 3/1996 | Barclay | |
| 6,566,971 B1* | 5/2003 | Gutierrez | 331/167 |
| 6,621,364 B2 | 9/2003 | Grewing et al. | |
| 6,774,736 B1* | 8/2004 | Kwek et al. | 331/177 V |
| 6,985,703 B2* | 1/2006 | Groe et al. | 455/108 |
| 2004/0150483 A1 | 8/2004 | Cho | |
| 2006/0033590 A1* | 2/2006 | Shigematsu | 331/177 V |

FOREIGN PATENT DOCUMENTS

WO   WO 03/061108 A1   7/2003

OTHER PUBLICATIONS

Ilsayed, A. et al.; "Differential PLL for Wireless Applications Using Differential CMOS LC-VCO and Differential Charge Pump"; Proceedings 1999 International Symposium on Low Power Electronics and Design (ISLPED); Aug. 16-17, 1999; pp. 243-248; ACM; New York, NY.

Berny, A. et al.; "A Wideband Low-phase-noise CMOS VCO"; Proceedings of the 2003 Custom Integrated Circuits Conference; Sep. 21-23, 2003; pp. 555-558; vol. Conf. 25; IEEE; New York, NY.

* cited by examiner

*Primary Examiner*—Robert J. Pascal
*Assistant Examiner*—Levi Gannon
(74) *Attorney, Agent, or Firm*—Lawrence E. Laubscher, Jr.

(57) ABSTRACT

A variable capacitor modulator for use in a voltage controlled oscillator, includes a differential varactor block, coupling capacitors for connecting nodes of the varactor block to a tank circuit, and an element connected between the respective nodes and ground to trim the gain of the variable capacitor modulator.

7 Claims, 7 Drawing Sheets

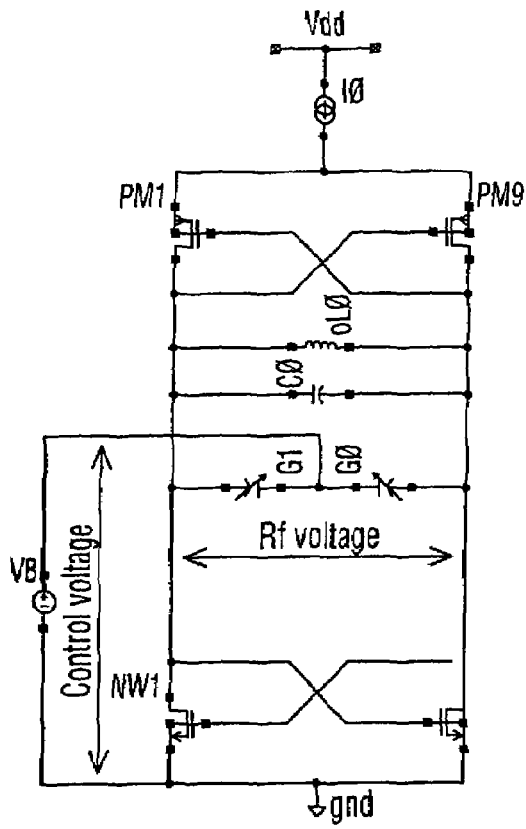 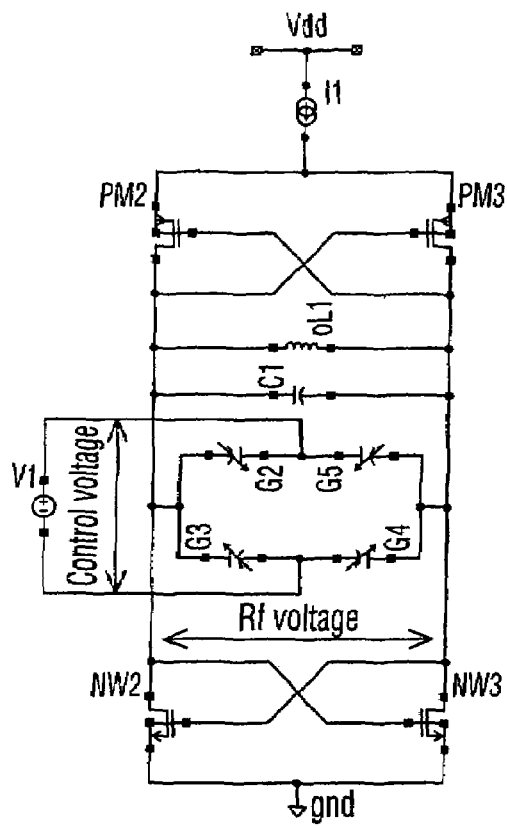
FIG. 1a  FIG. 1b
PRIOR ART
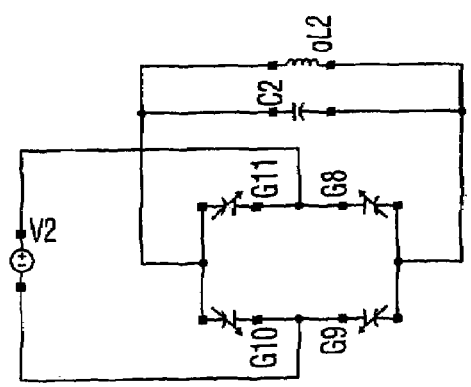 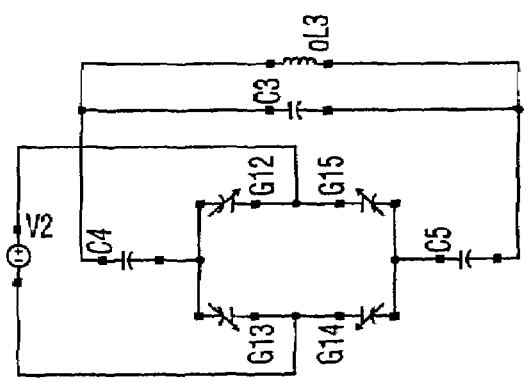
FIG. 2a  FIG. 2b
PRIOR ART

DIRECTLY MODULATED CMOS VCO

CROSS REFERENCE TO RELATED APPLICATION

This application claims the benefit under 35 USC 119(e) of U.S. provisional application No. 60/544,169, filed Feb. 12, 2004 the contents of which are herein incorporated by reference.

FIELD OF THE INVENTION

This invention relates to the field of wireless communication systems, and in particular to a variable controlled oscillator for use in such systems.

BACKGROUND OF THE INVENTION

The rapidly growing market of personal communication systems, radio medical implanted systems, and wireless hearing aids provides an increasing demand for more integrated and more efficient radio frequency (RF) integrated circuits (IC's). These IC's are required to operate with supply voltages under 2 V and sometimes down to 1V with minimum current consumption at frequencies up to several GHz.

The recent progress of CMOS technology has considerably improved the transmit freqeuncy of the CMOS devices and made CMOS technology a viable choice for RF integrated circuits allowing cost effective one chip solution.

The transmitter is one of the mostly power hungry blocks of wireless systems. For current saving it is beneficial to use a directly modulated voltage-controlled oscillator (VCO) that operates at the transmit frequency as a signal generator for the transmitter. The modulated signal from the VCO can be amplified by the output stage and applied to an antenna directly or via a filter.

This architecture is simple but very flexible since the output stage can control the output power over a wide range and the antenna parameters can vary with application.

A good example of this transmit architecture is presented by "1 GHz FM transmitter" operating in any 26 MHz band from 100-1000 MHz described in document NT2800 CHIPMITTER, www.numatechnologies.com/pdf/NT2800.

In some cases when the antenna is made as a high Q inductor with the self-resonant frequency more than 70% above the transmit frequency it is possible that VCO itself can operate as a transmitter. It allows one to save the current used in the output stage.

In this solution the output power range is limited by 12-20 dB depending on the antenna parameters and the supply voltage. This is because the high power is determined by voltage supply while the low power is defined by the minimum level of sustained oscillations.

The major disadvantage of the transmit VCO is that the modulation index tends to depend on the transmit power. This is because the varactor cell based on a MOS capacitor has a relatively narrow voltage control range that closely correlates with the MOS transistor threshold voltage. The typical range is +/−0.5 V while the voltage swing across the tank could be up to several volts. Due to this fact the VCO frequency is sensitive not only to the control voltage applied to the varactor cell but also to the voltage swing across the VCO tank. This fact causes either the power range limitation or the index modulation variations.

The most popular CMOS VCO configurations are based on the differential approach (Andreani, S. Mattisson "On the use of CMOS varactors in RF VCO's," IEEE J. Solid States circuits, vol. 35, pp. 905-910, June 20) in which two differentially connected varactors or a complete varactor bridge are used for the frequency control (FIG. 1).

The differential approach provides the most efficient way to get high power and S NR under voltage supply limitation. Also control voltage is applied to the nodes with zero RF voltage so control voltage source does not cause additional losses in the LC-resonator.

The varactor block can be connected to the LC-tank circuit directly or via coupling capacitors (U.S. Pat. No. 6,621,365) intended to reduce the VCO gain (FIG. 2).

These coupling capacitors also reduce RF voltage swing across varactors and help to suppress frequency to power sensitivity.

In the direct modulation VCO modulation can be obtained by applying a modulation voltage to the varactor block in addition to the control voltage which sets the carrier centre frequency (FIG. 3).

The disadvantage of this approach is illustrated is that the high VCO gain (~10 MHz/V) required for the PLL (phase locked loop) means that the modulation voltage swing necessary for peak-to-peak frequency deviation (0.5-2 MHz at 400 MHz) should be 0.05-0.2 V peak-to-peak. Too low level of modulation voltage makes it difficult to control modulation index accurately. Also this low modulation voltage level means low signal to noise ratio. VCO gain variation with RF voltage swing (RF power) also affects modulation index.

Another way to provide modulation is to add an additional varactor block, which is connected to the LC-tank in parallel to the varactor block used for carrier frequency control. The additional block has a separate control voltage input and lower gain (FIG. 4).

The lower gain permits a higher modulation voltage and a larger signal to noise ratio. The modulation index can be controlled not only by modulation voltage swing, but in addition by means of variable variable capacitance sensitivity of the modulation varactor block, leaving appropriate high gain required for PLL loop.

As mentioned above the lower gain can be achieved with the varactor block connected to the LC-tank via coupling capacitors. But coupling capacitors can not be used to trim the gain in the modulation varactor block because both their pins supplied with rather high voltage and CMOS switches used to connect coupling capacitor segments are less effective due to smaller gate to source voltage and higher resistance while thy will be in the RF current path. So they kill the resonator Q-factor or add too much parasitics. Switched capacitors connected parallel to the modulation varactor block are also not suitable for the same reason.

A known way (Chi-Wa Lo, H. C. Luong "A 1.5V 900-MHz Monolithic CMOS Fast-Switching Frequency Synthesizer for Wireless Applications", IEEE J. Solid-State Circuits, vol. 37, No 4, pp. 459-470, April 2002) is used to trim RF carrier frequency coarsely with switched capacitors connected between the VCO outputs and ground (FIG. 5).

This solution is not suitable for trimming the modulation varactor block sensitivity because these switched capacitors affect the total capacitance connected to the LC-tank, but do not affect the dC/dV. It might seem that the modulator gain would still be affected by these capacitors since frequency depends on relative tank capacitance deviation dC/C which depends also on the denominator, but the PLL actually keeps total LC-tank capacitance constant for certain RF carrier frequency, so the denominator is actually constant.

A variable modulator capacitor with trimmed gain can be obtained with solution shown in FIG. 6, where top pins of two arrays of switched varactors are connected to the LC-tank via coupling capacitors. Modulation voltage is applied to these top pins relative to ground via resistors. Bottom pins of the switched varactors can be connected to ground via NMOS switches depending on required modulator gain. The disadvantage of this solution is incomplete utilization of the varactor's C-V characteristic since only positive modulation voltage can be applied relative to ground. Also full power RF voltage and control voltage are applied to the same top pin of the varactor and resistors used to decouple modulator voltage source from RF voltage cause additional unwanted losses and parasitics in the LC-tank.

SUMMARY OF THE INVENTION

In one aspect the invention provides a modulation variable capacitor with trimmed gain containing a differential varactor block connected to the main LC-tank via two preferably equal coupling capacitors also having two preferably identical switched trim capacitors each connected between the ground and one of the nodes where the coupling capacitors are connected to the varactor block.

In another aspect the invention provides a direct modulation-differential VCO having a separate modulation varactor block connected to the LC-tank via two preferably equal coupling capacitors, additionally having preferably two identical switched trim capacitors each connected between the ground and one of the nodes where the coupling capacitors are connected to the modulation varactor block.

A VCO in accordance with the principles of the invention has all the described advantages of the separate modulation varactor block: a small modulation varactor block gain set independently of the main VCO gain required for PLL control; low level of RF voltage across the modulation varactors and smaller effect of RF power on the modulation index; control voltage is applied to the nodes with zero RF voltage and does not affect the LC-tank Q-factor; and complete varactor control voltage range is utilized.

In addition this solution allows trimming the modulator variable capacitor gain in a very wide range with maximum to minimum gain ratio up to 4. This gain variation is caused by a specific capacitor division effect and takes place even when the PLL keeps total tank capacitance constant. Trim capacitors are connected here in the way minimizing Q-factor loss: bottom pins of switched on trim capacitor segments are always near zero voltage while NMOS switches used to switch trim capacitor segments can be put between the ground and bottom trimcap segment pins where they have minimum possible resistance so their size and parasitics can be minimized. A very small modulation capacitance deviation can be achieved with this solution—as low as 12 fF for ~1V modulation voltage. Additional modulation voltage swing trimming in this approach can provide even smaller capacitance variation and very accurate control of the modulation index.

The method further provides a method of controlling a directly modulated voltage controlled oscillator comprising providing a modulation variable capacitor; and adjusting the gain of said modulation variable capacitor.

BRIEF DESCRIPTION OF THE DRAWINGS

The invention will now be described, by way of example only, with reference to the accompanying drawings, in which:

FIGS. 1a and 1b show a prior art VCO with 2 varactors (a) and a full varactor bridge (b) connected differentially;

FIGS. 2a and 2b show a varactor block connected to the LC-tank directly (a) and (b) via coupling capacitors;

DETAILED DESCRIPTION OF THE PREFERRED EMBODIMENTS

Figure 3:
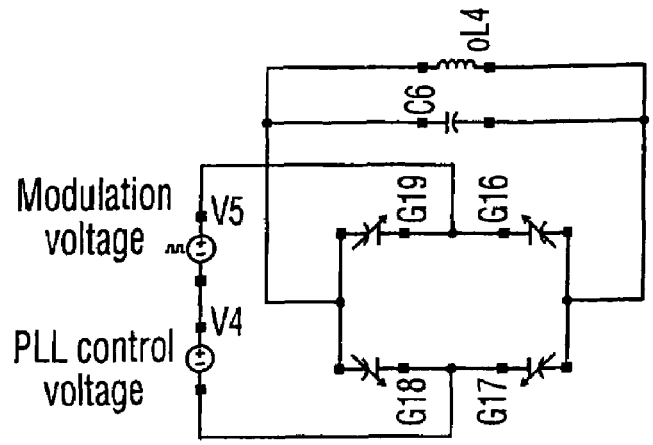
FIG. 3 shows a direct modulation scheme utilizing the same varactor block intended for carrier frequency control.
Figure 4:
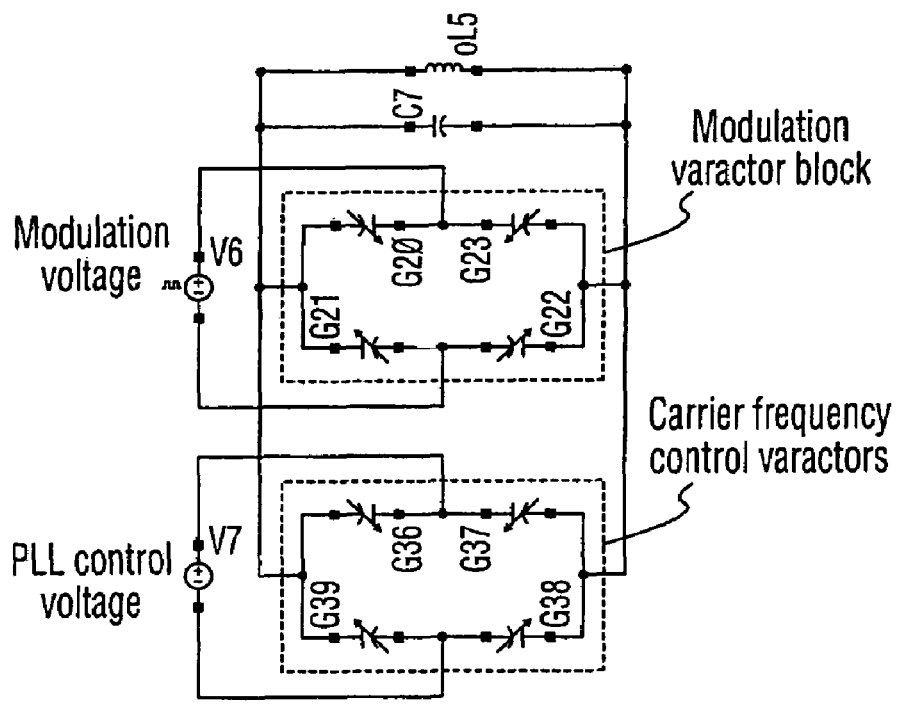
FIG. 4 shows a direct modulation scheme with separate varactor blocks for modulation and carrier frequency control.
Figure 5:
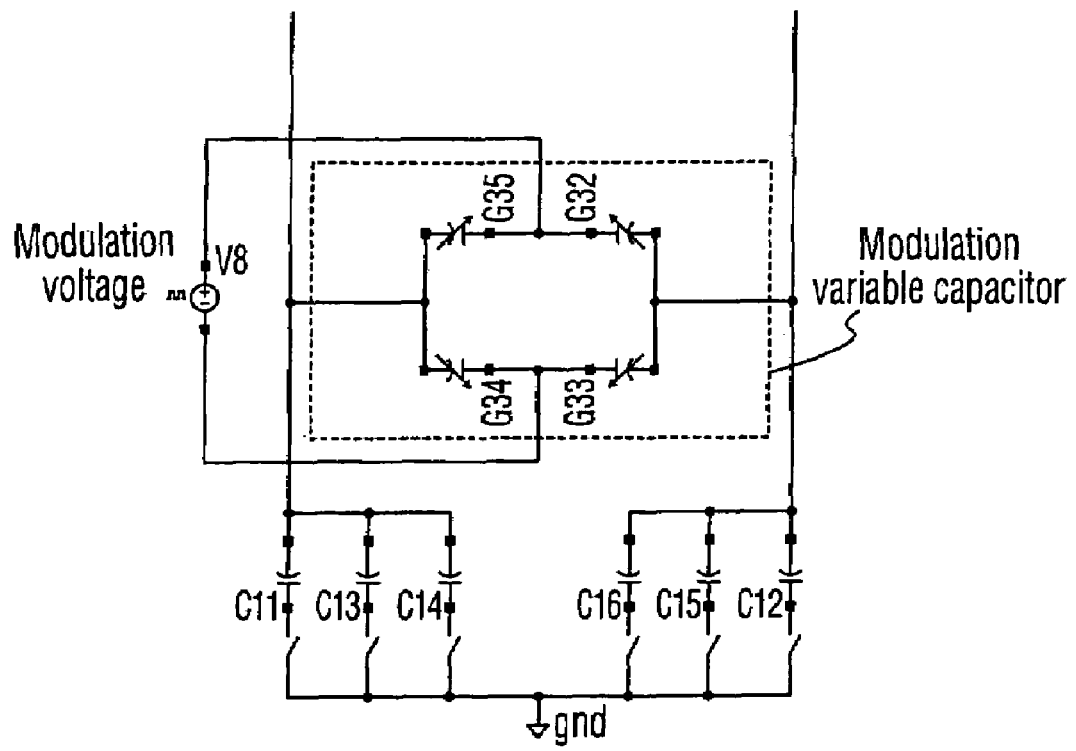
FIG. 5 shows the coarse tuning of the IC-tank resonant frequency by means of switched capacitors connected to ground.
Figure 6:
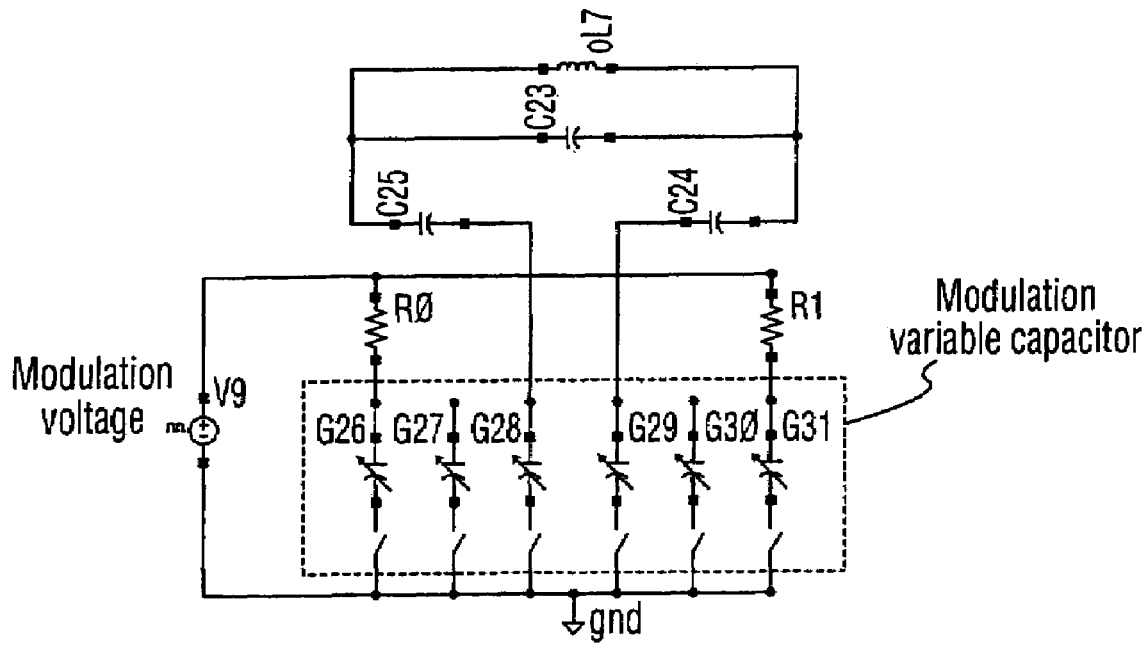
FIG. 6 shows modulator gain trimming by means of switched varactors connected to ground.
Figure 7:
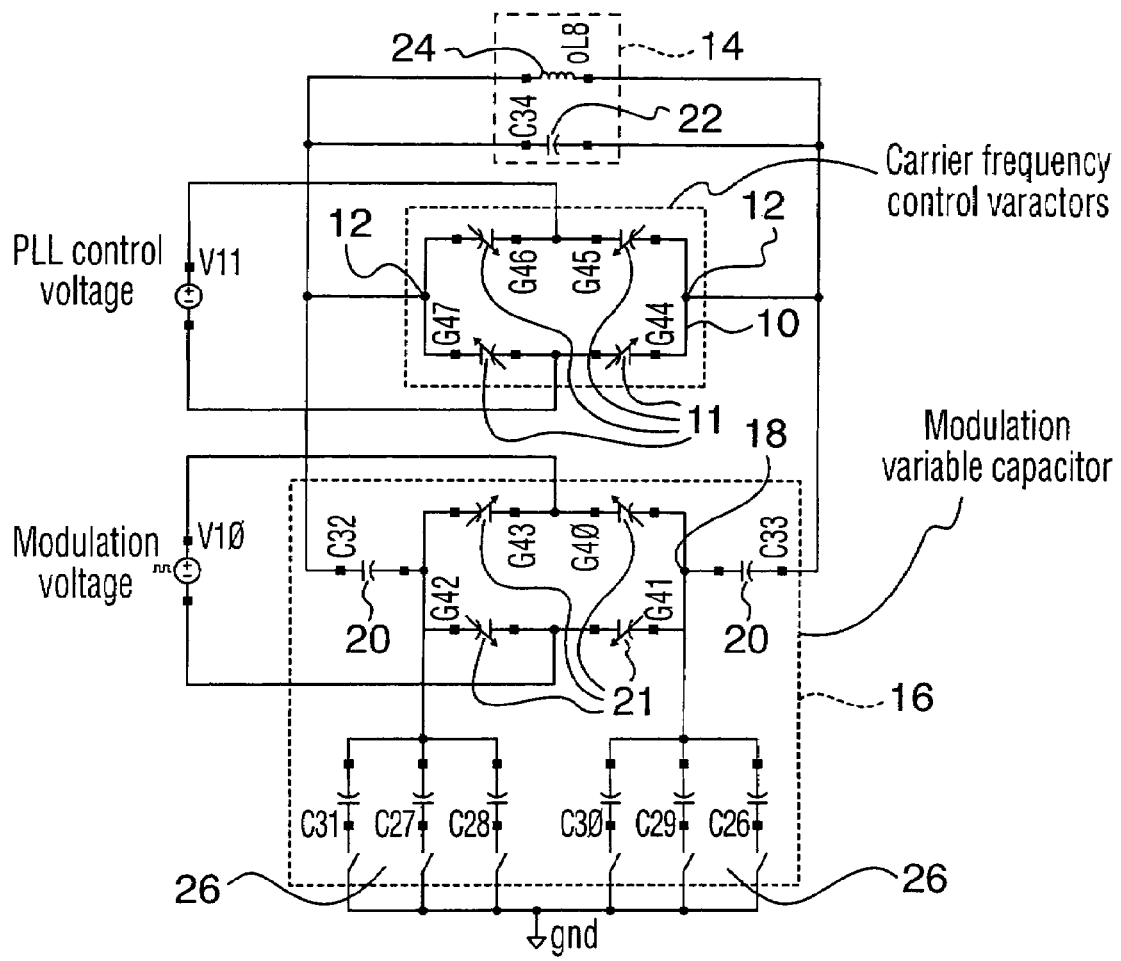
FIG. 7 shows a modulator varactor capacitor with trimmed gain differentially connected to an LC-tank in accordance with the principles of the invention.

An example of a variable modulator capacitor used in the direct modulation VCO made in CMOS RF process will be described with reference to FIG. 7. The circuit shown in FIG. 7 comprises a carrier frequency control varactor block 10, including varactors 11, which is coupled at nodes 12 to tank circuit 14. The tank circuit 14 comprises capacitor 22 and inductance 24 in a manner known per se.

The modulation varactor block 16, including varactors 21, is coupled at nodes 18 through equal coupling capacitors 20 to the tank circuit 14.

Figure 8:
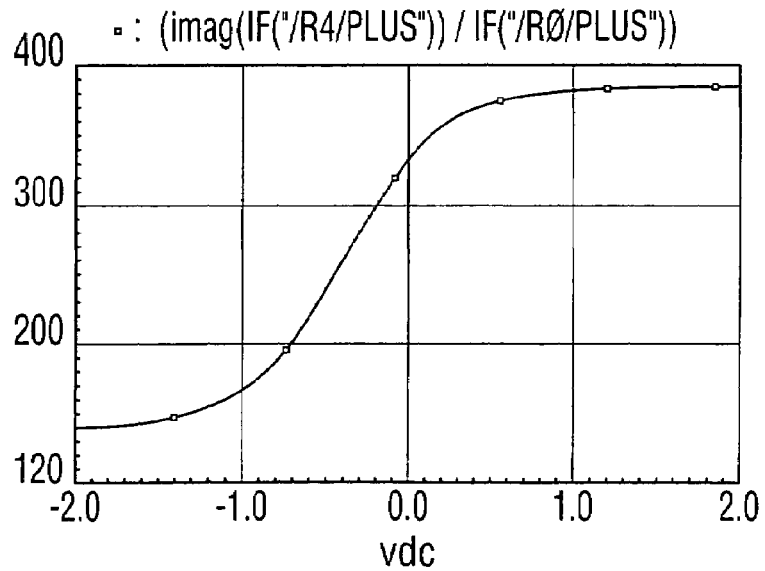
FIG. 8 shows an AMOS varactor cell C-V characteristic.

Nodes 18 are connected to ground through identical arrays of switched trim capacitors 26. Both the coupling capacitors 20 and switched capacitors 26 are made from MOM (Metal-Oxide-Metal) primitive capacitor cells of 64fF each. AMOS varactor cells used in the blocks 10, 16 typically have C-V characteristic as shown in FIG. 8.

The varactor capacitance Cv varies from 0.15 to 0.38 pF as the control voltage changes from −1.5V to 0.5V, but in the useful near linear region the range is narrower: about −0.9 . . . +0.2V.

Figure 9:
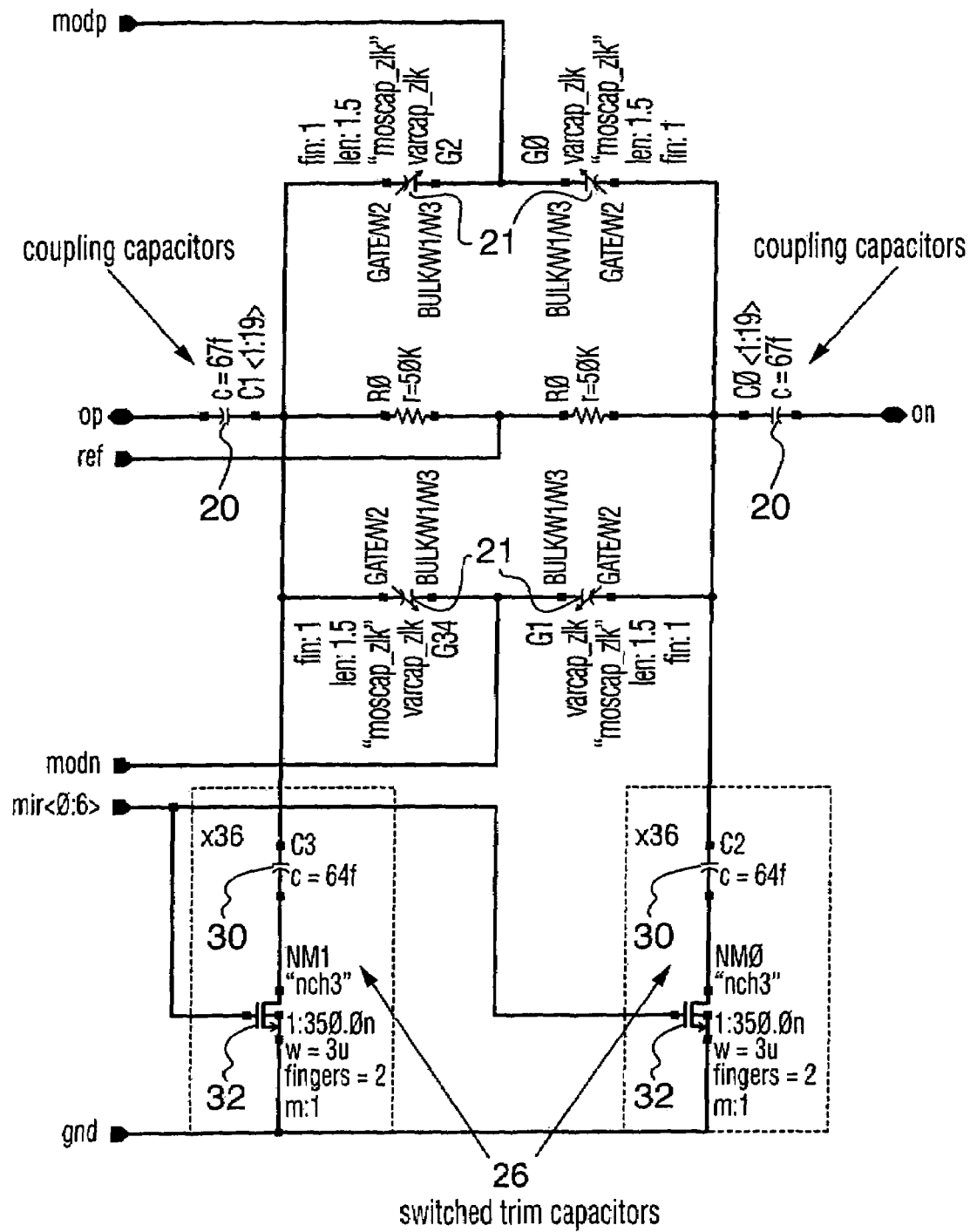
FIG. 9 shows a modulator variable capacitor schematic.

A complete modulator variable capacitor example schematic is shown in FIG. 9. Here one switched trim capacitor 26 is provided for each node. The switch trim capacitors comprise capacitors 30 and NMOS switches 32.

The variable capacitor component values are following: Coupling capacitors 20 include 19 parallel-connected 64 fF capacitors each, making a total coupling capacitor capacitance Cc=1.22 pF each. Each of the two switched trim capacitors 26 contains 36 cells with a 64 fF capacitor connected to ground via NMOSFET W/L=3/0.35 µm. These 36 switched capacitor cells are grouped into 7 sections containing 3, 3, 4, 5, 6, 7, 8 cells respectively, which controlled by 7-bit thermometric code mir<0:6>.

Figure 10:
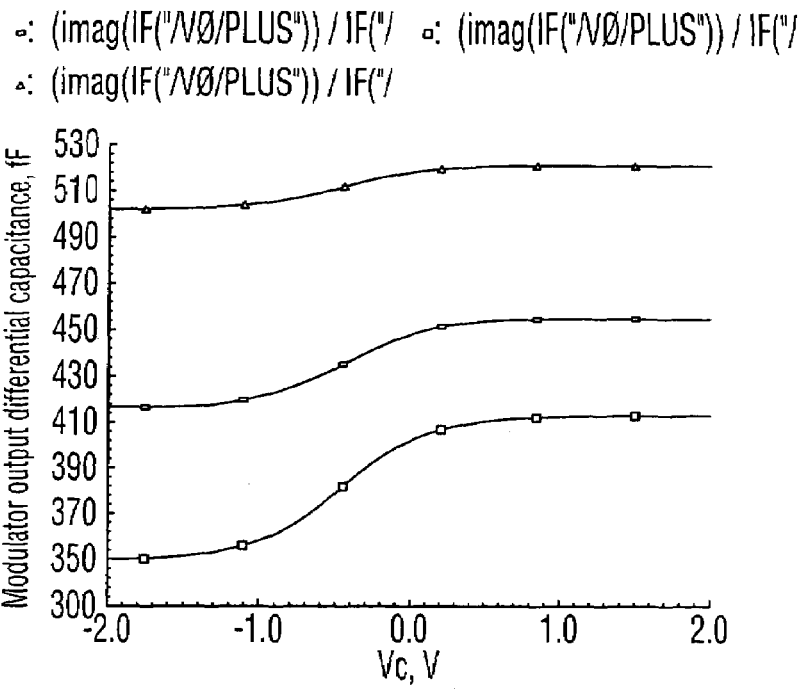
FIG. 10 shows the differential capacitance of the modulation variable capacitor versus ½ modulation voltage for 3 different trim codes

This seven bit thermometric code creates 8 different states with 0, 3, 6, 10, 15, 21, 28 and 36 primitive trim capacitor cells switched on (from 0 to 2.3 pF). Such trim capacitor sectioning provides such nonlinear trim capacitance dependence versus code which finally gives almost linear modulator variable capacitor gain (i.e. delta C for certain modulation voltage swing) variation versus control code (FIG. 10). Larger trim capacitance gives smaller modulator gain.

The varactor bridge in FIG. 9 contains 4 varactor cells 21. Depending on the trim code and the varactor bridge control voltage, the RF voltage across the varactor bridge due to capacitor the division effect is 0.3-0.8 of the full power RF voltage across the LC-tank 14.

The output differential capacitance of the modulator variable capacitor versus half bridge voltage for three different trim codes is shown in FIG. 10. This figure demonstrates that additional trim capacitors (from bottom curve to top in FIG. 10) increase the total capacitance but decrease the variable part of the total capacitance.

Figure 11:
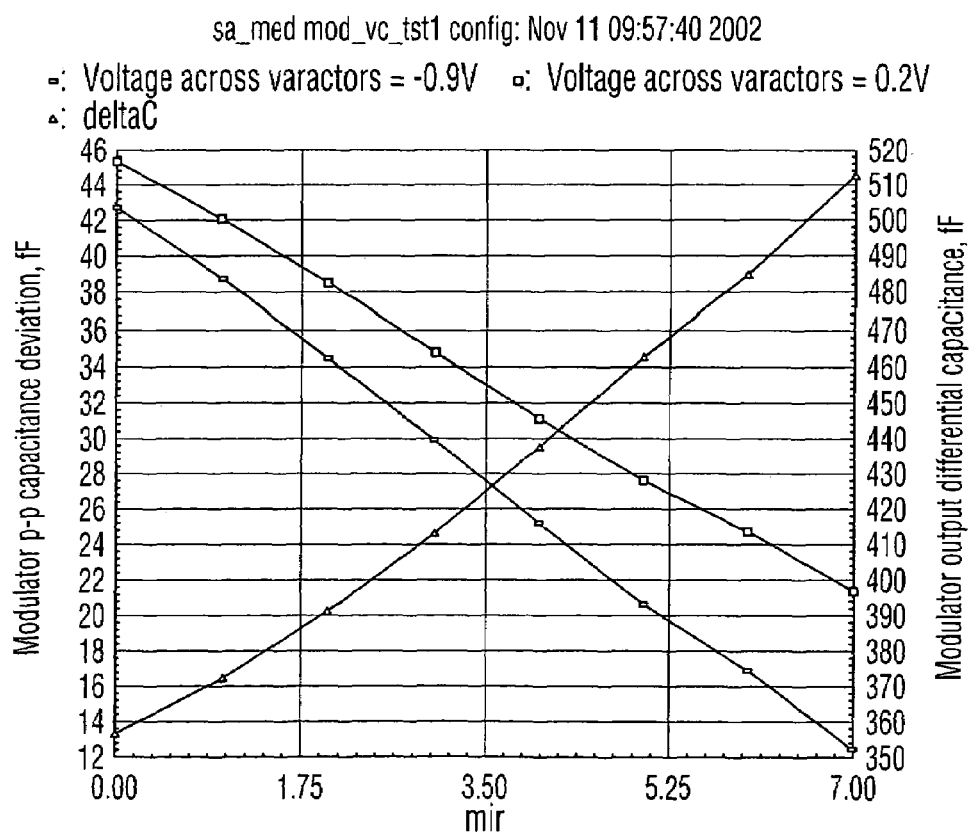
FIG. 11 shows the modulator variable capacitor trimming characteristics.

More detailed modulator trimming characteristics are represented in FIG. 11. The total output modulator variable capacitance versus trim (mir) code in FIG. 11 is represented by 2 curves falling with trim code. For mir=0 all groups of trim capacitors are connected while for mir=7 all groups are disconnected. These two curves relate to half bridge modulation voltage −0.9V and 0.2V respectively corresponding to the edges of useful varactor control voltage range. Peak-to-peak capacitance deviation for half bridge voltage step −0.9 to 0.2V versus trim code is represented in FIG. 11 by delta C curve (rising with trim code). Delta C varies near linearly from 13 to 44 fF with trim code from 0 to 7 in this example. Total modulator capacitance is decreased from approximately 515 to 350 fF with trim code. This total capacitance variation versus trim code is parasitic but is cancelled by PLL loop which keeps total LC-tank capacitance constant.

Figure 12:
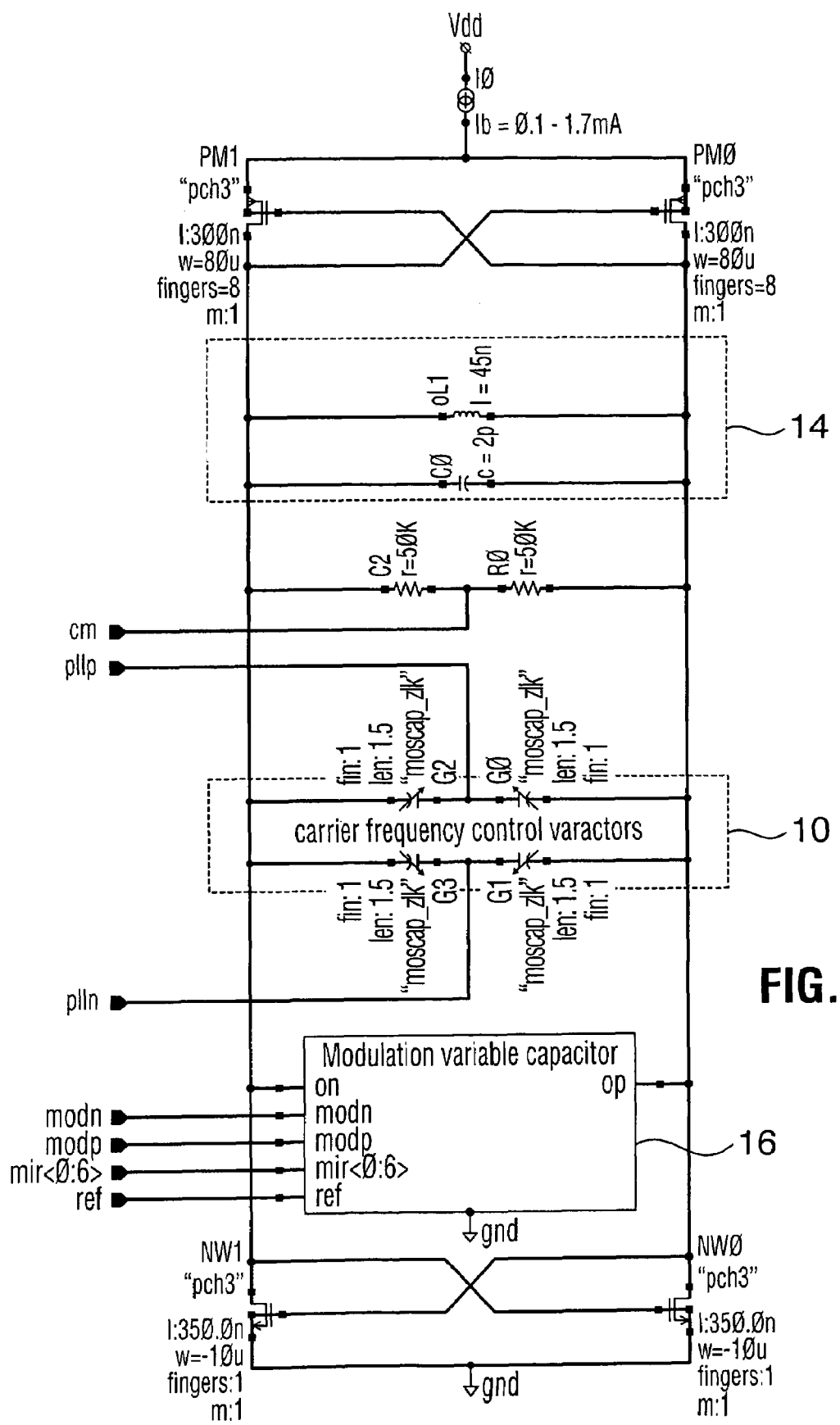
FIG. 12 shows a voltage control oscillator circuit schematic.

An example of a proposed direct modulation VCO simplified schematic of a practical circuit with modulator variable capacitor is shown in FIG. 12. This shows the modulation varactor block 16, the carrier frequency control block 10, and the tank circuit 14.

The invention claimed is:

1. A directly modulated voltage controlled oscillator including a tank circuit comprising:
   a carrier frequency varactor circuit for generating a carrier frequency determined by a control voltage applied from a control voltage source, said carrier frequency varactor circuit comprising first and second pairs of varactors in a differential arrangement, wherein said first and second pairs of varactors are arranged in parallel between a first pair of nodes connected directly across the tank circuit without coupling capacitors, and wherein a second pair of nodes at respective common connection points of each of said varactors of said first and second pairs of varactors is connected across said control voltage source;
   a separate modulation varactor circuit for modulating the carrier frequency generated by the carrier frequency varactor circuit in response to a modulation voltage applied from a modulation voltage source, said modulation varactor circuit comprising third and fourth pairs of varactors in a differential arrangement, wherein said third and fourth pairs of varactors are arranged in parallel between a third pair of nodes, and wherein a fourth pair of nodes at respective common connection points of each of said varactors of said third and fourth pairs of varactors is connected across said modulation voltage source;
   coupling capacitors for connecting respective nodes of said third pair of nodes across said tank circuit and to said respective first pair of nodes; and
   groups of parallel-connected switched trim capacitors connecting the respective nodes of said third pair of nodes to ground to trim the gain of said modulation varactor circuit.

2. A directly modulated voltage controlled oscillator as claimed in claim 1, wherein said coupling capacitors are substantially equal.

3. A directly modulated voltage controlled oscillator as claimed in claim 2, wherein said switched trim capacitors are identical.

4. A directly modulated voltage controlled oscillator as claimed in claim 3, wherein said switched trim capacitors comprise an array.

5. A directly modulated voltage controlled oscillator as claimed in claim 1, wherein said coupling capacitors and said switched trim capacitors are made from MOM capacitor cells.

6. A method of controlling a directly modulated voltage controlled oscillator including a tank circuit, comprising:
   generating a carrier frequency determined by a control voltage applied from a control voltage source with a first varactor circuit connected to the tank circuit, wherein said first varactor circuit comprises first and second pairs of varactors in a differential arrangement, wherein said first and second pairs of varactors are arranged in parallel between a first pair of nodes connected directly across the tank circuit without coupling capacitors, and wherein a second pair of nodes at respective common points of each of said varactors of said first and second pairs of varactors is connected across said control voltage source;
   modulating the carrier frequency with a separate modulation varactor circuit in response to a modulation voltage applied from a modulation voltage source, wherein said modulation varactor circuit comprises third and fourth pairs of varactors in a differential arrangement, wherein said third and fourth pairs of varactors are arranged in parallel between a third pair of nodes connected across said tank circuit and said respective first pair of nodes through respective coupling capacitors, and wherein a fourth pair of nodes at respective common points of each of said varactors of said third and fourth pairs of varactors is connected across a modulation voltage source; and
   trimming the gain of said modulation varactor circuit with groups of parallel-connected switched trim capacitors connecting respective nodes of said third pair of nodes to ground.

7. A method as claimed in claim 6, wherein said gain is adjusted with switched trim capacitors to minimize Q-factor loss.

* * * * *